United States Patent
Yoshida et al.

(12)

(10) Patent No.: US 6,358,390 B1
(45) Date of Patent: Mar. 19, 2002

(54) METHOD FOR FORMING ELECTRODE

(75) Inventors: Yasushi Yoshida, Shiga-ken; Tatsuo Kunishi, Takefu, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/670,930

(22) Filed: Sep. 28, 2000

(30) Foreign Application Priority Data

Sep. 28, 1999 (JP) ............................................ 11-274829

(51) Int. Cl.[7] ................................................. C25D 5/54
(52) U.S. Cl. ..................................................... 205/163
(58) Field of Search ................................. 205/163, 187

(56) References Cited

U.S. PATENT DOCUMENTS

| | | | | |
|---|---|---|---|---|
| 4,448,804 A | * | 5/1984 | Amelio et al. ................. | 427/98 |
| 5,443,865 A | * | 8/1995 | Tisdale et al. ............... | 427/304 |
| 5,616,230 A | | 4/1997 | Otsuka et al. .............. | 205/125 |

FOREIGN PATENT DOCUMENTS

| | | |
|---|---|---|
| EP | 0905285 A1 | 3/1999 |
| JP | 7-9078 | 2/1995 |

* cited by examiner

*Primary Examiner*—Edna Wong
(74) *Attorney, Agent, or Firm*—Ostrolenk, Faber, Gerb & Soffen, LLP

(57) ABSTRACT

A method for forming an electrode on a surface of an electronic device formed of a ceramic material is disclosed. The method comprises the steps of: adjusting a polarity of a surface charge by immersing the electronic device in a solution containing a cationic or an anionic surfactant; depositing an electroconductive material on the surface of the electronic device by contacting the electronic device with an electroconductive solution containing the electroconductive material having a polarity opposite to the adjusted polarity of the surface charge; and performing electrolytic plating using the electroconductive material deposited on the surface of the electronic device as an underlying metal film.

20 Claims, No Drawings

METHOD FOR FORMING ELECTRODE

BACKGROUND OF THE INVENTION

1. Field of the Invention

The present invention relates to methods for forming electrodes for electronic devices. In particular, the present invention relates to a method for forming electrodes for electronic devices formed of a ceramic material or a composite ceramic material composed of a ceramic and a resin.

2. Description of the Related Art

Hitherto, in order to form electrodes on surfaces of electronic devices which are formed of non-electroconductive materials (or poorly electroconductive materials), such as ceramics, composite ceramic materials composed of ceramics and resins, or the like (hereinafter collectively referred to as a "ceramic material"), various methods have been employed, for example, sputtering, deposition, printing of an electroconductive paste, electroless plating, or an electrolytic plating after an electroconductive treatment applied to surfaces of electronic devices by the methods mentioned above.

Formation of electrodes by sputtering and deposition is performed by the following methods. An electronic device is placed in a vacuum container, a metal lump to be used as an electrode material is melted by resistance heating, electron beam or the like so as to vaporize as metal atoms for deposition, or on the other hand, a metal target is bombarded with an inert gas such as argon so as to yield metal atoms for sputtering. Individual films are formed by deposition of associated metal atoms described above on surfaces of the electronic devices, so that electrodes are formed. However, the methods described above have problems in that expensive and large apparatuses are necessary, deposition is relatively slow, it is difficult to fill and form an electrode inside a through hole having a high aspect ratio, the manufacturing costs are high due to poor performance in mass production, and the like. Accordingly, the advantage of these methods as methods for forming electrodes of electronic devices that must be mass-produced has been relatively low.

Formation of electrodes by printing an electroconductive paste is performed by the following method. That is, a powdered metal in the form of a paste is coated on an electronic device by printing, and the device is baked in a baking furnace at several hundreds to one thousand and several hundreds degree Celsius, whereby an electrode is formed. However, since a baking process at a high temperature is necessary, the method cannot be applied to an electronic device formed of a material having a relatively low melting point, such as a composite ceramic material composed of a resin and a ceramic. In addition, since an electroconductive paste generally contains a glass frit, and the glass frit may react with a ceramic material during baking, there are fears in that electric characteristics of the device may vary and/or physical strength thereof may be degraded in some cases.

Formation of electrodes by electroless plating is performed by a method of, for example, immersion in a solution composed of a complex or a colloid containing palladium or tin, so that a catalytic metal is deposited on a surface of a ceramic material having no electric conductivity. In this state, when a ceramic material is immersed in an electroless plating bath composed of a metal ion, a complexing agent, a reducing agent, an additive, and the like, a reduction reaction occurs by catalytic action of the catalytic metal, and hence, an electrode composed of a metal plated film is formed on the surface of the ceramic material. However, troublesome procedures for controlling the plating bath are necessary for the method described above, since, for example, the composition of the plating bath is complicated, a reducing agent or the like must be constantly supplied, and performance of the plating bath is degraded by generation of by-product materials such as oxides. In addition, disposal of wastewater from the plating bath is difficult and expensive. Furthermore, there are problems in the practical use of the method, such as slow deposition rate during plating, gas pockets generated by hydrogen, and the like.

Formation of electrodes by electrolytic plating is performed by the following method. That is, a metal film, which is to be used as an underlying layer, is formed on a surface of a ceramic material beforehand by sputtering, deposition, printing, electroless plating, or the like. The ceramic material is then immersed in an electrolytic plating bath containing a metal ion, and the metal is deposited on the metal film by conducting electricity in the underlying metal film, whereby an electrode composed of a metal plated film is formed. However, in the method described above, when an electrode is formed on a non-conductive material, an underlying layer for depositing a metal ion must be formed beforehand, so that the number of steps is increased, and the cost thereof is increased. In addition, the process in the method described above is accompanied by problems previously described in the various methods for forming an underlying metal film.

As a method for forming electrodes, which solves the problems of the method for forming electrodes described above, a method called the "direct plating method" has recently attracted attention. This is a method in which a palladium-tin colloid, powdered carbon or powdered graphite is adsorbed inside through holes formed in printed circuit boards, or the like so that the through holes are electroconductive, a metal is then deposited inside the through holes by electrolytic plating, and as a result, electrodes are formed. According to this method, a process for forming an underlying metal film prior to electrolytic plating can be simplified, and hence, the cost for forming electrodes can be considerably reduced. However, the method cannot be applied to a formation method for electrodes for electronic devices formed of ceramic materials. That is, an electroconductive material, such as a palladium-tin colloid, used in this method has a characteristic in that it is easily bonded with chemical groups, such as hydroxide and carbonyl groups. By etching a resin material forming a printed circuit board or the like using an alkali or the like, these chemical groups mentioned above can be formed on a surface of the resin material. As a result, an electroconductive material can be deposited on the surface of the printed circuit board. On the other hand, chemical groups cannot be formed on the surface of a ceramic material by etching or the like, and hence, an electroconductive material cannot be deposited and an electrode cannot be formed.

SUMMARY OF THE INVENTION

Accordingly, an object of the present invention is to realize a method for depositing an electroconductive material on a surface of an electronic device, the lack of which has been the reason direct plating cannot be applied to an electronic device composed of a ceramic material, and is to provide a method for forming an electrode of an electronic device in which the process thereof is simple, the production cost thereof is reduced and characteristics of the electronic device cannot be degraded.

The method for forming an electrode on a surface of an electronic device formed of a ceramic material comprises the steps of: adjusting a polarity of a surface charge by contacting, e.g., by immersing, the electronic device in a solution containing a cationic or an anionic surfactant; depositing an electroconductive material on the surface of the electronic device by contacting the electronic device with an electroconductive solution containing the electroconductive material having a polarity opposite to the adjusted polarity of the surface charge; and performing electrolytic plating using the electroconductive material deposited on the surface of the electronic device as an underlying metal film.

Any cationic or anionic surfactant which can impart a surface charge to the electronic device can be used. Typical anionic surfactants which can be used are linear alkylbenzenesulfonic acid, polycarbonic acid, polyoxycarbonic acid, phenolsulfonic acid, alkylether sulfate and polyacrylamide type polymer. Typical cationic surfactants which can be used are picopynium salt, chlorotrimethyllaurylammonium salt, chlorooctylpyridinum salt, water-soluble polymer, polyoxyethylene glycol and tertiaryammonium salt.

The electroconductive solution preferably comprises at least one of a complex, colloid, hydroxide of a transition metal, mixture of complexes, mixture of colloids, or mixture of hydroxides formed by the combination of the transition metals.

In addition, the transition metal is preferably at least one selected from the group consisting of palladium, silver, copper, tin and nickel.

During the step of performing electrolytic plating, the current density is preferably maintained low at an initial stage in electrolytic plating, and the current density is gradually increased after an elapse of a predetermined time.

According to the present invention, the process therefor can be simplified and the production cost thereof can be reduced without impairing the film characteristics for the electrodes in the formation of external lead electrodes for chip devices and the like.

DETAILED DESCRIPTION OF PREFERRED EMBODIMENTS

Through intensive research by the inventors of the present invention to achieve the object described above, the following method was discovered, and hence, the present invention was completed. In the method, an electronic device is immersed in a solution containing a cationic or an anionic surfactant so as to adjust the polarity of a surface charge thereof, and by contacting the electronic device with an electroconductive solution containing an electroconductive material having a polarity opposite to that of the surface charge, the electroconductive material is deposited on the surface of the electronic device (by an electrostatic bonding). Subsequently, by performing electrolytic plating using the electroconductive material deposited on the surface of the device as an underlying metal film, an electrode can be formed on the surface of the electronic device. According to the method, in addition to it being possible to simplify a process for forming an underlying metal film, an electrode can be formed on a ceramic material by electrolytic plating.

As an electronic device to which the present invention can be preferably applied, an electronic device having a surface in which electric conductivity thereof is so low that electrolytic plating cannot be performed directly thereon (in particular, when resistivity thereof is approximately 100 Ω·cm or more) may be mentioned. The electronic device described above includes devices composed of ceramic materials, such as an insulating material, a dielectric material, a piezoelectric material, a pyroelectric material, a magnetic material, and the like, and composite ceramic materials composed of these ceramic materials mentioned above and a resin. The shapes and dimensions of the electronic device described above are not limited, and the present invention can also be preferably applied to electronic devices having penetrating holes or concave-convex shapes.

According to the present invention, an electronic device, this surface of which is washed by a method of degreasing, etching or the like, is immersed in a solution (hereinafter referred to as a conditioning solution) containing a cationic or an anionic surfactant, so that the surface of the electronic device is provided with a positive or negative electric polarity. Concerning the conditioning solution, a surfactant having a cationic or an anionic polarity may be selected so that the polarity thereof is opposite to an electric polarity in an electroconductive solution, which is used in the following electroconductive step. That is, the surface of the electronic device is provided with an electric polarity by the conditioning solution, and by contacting the electronic device with the electroconductive solution containing an electroconductive material having an opposite polarity thereto, an electric attracting force between the surface of the electronic device and the electroconductive material is generated, whereby the electroconductive material is efficiently deposited on the surface of the electronic device. For example, when the electroconductive solution is an acidic mixed colloid solution composed of palladium and tin, since the mixed colloid of palladium and tin has a negative electric polarity, a cationic surfactant may be used for a conditioning solution. As described above, an electroconductive material is deposited on a surface of an electronic device, the electroconductive material is then activated in a diluted acidic solution, and subsequently, a step of electrolytic plating is performed.

In the step of depositing the electroconductive material on the surface of the electronic device described above, the electroconductive material may be deposited over the entire surface of the electronic device, or it may be deposited selectively by using a predetermined masking method, such as by using a resist.

In the step of electrolytic plating, various electrolytic plating methods, such as a barrel plating method or a rack plating method, may be employed. However, in the case of electrolytic plating on electronic chip devices, barrel plating may be most preferably used. The metal to be deposited by plating is not specifically so limited; however, as electrodes for electronic devices, copper, nickel, tin, gold, platinum, palladium or an alloy thereof is preferably deposited. In addition, the present invention can be applied to any kind of plating bath, such as an acidic bath, a neutral bath or an alkaline bath.

In the step of electrolytic plating, the current density may differ in accordance with an electrolytic plating bath to be used; however, it is preferable that current density be maintained low at the beginning of plating and that it be gradually increased as time elapses. The particular current density at the beginning differs in accordance with a kind of plating bath, and generally, it is preferably to be approximately a half to one-twentieth of a desired current density. Consequently, roughness of the plated film caused by hydrogen generation at the initial stage of plating can be avoided, and a plated film having a uniform and superior film quality can be formed.

Hereinafter, the present invention will be further described by the specific examples.

FIRST EXAMPLE

An external copper electrode was formed by the following method on the entire surface of a dielectric resonator in the form of a block (20×8×5 mm and having penetrating holes 0.4 to 1.0 mm in diameter) primarily composed of barium titanate. The dielectric resonator was washed with an alkaline cleaner and was then washed with water. The surface of the dielectric resonator was then etched by immersing it in a mixed solution of hydrofluoric acid and hydrochloric acid, in which each concentration thereof was approximately 1 to 3%, and was again washed with water. Next, the resonator was immersed in a conditioning solution composed of a cationic surfactant in an amount of 3 g/liter composed of a polyoxyethylene glycol at 40° C. for 3 minutes, was then immersed in an electroconductive solution having a pH of 2.0 at 50° C. for 10 minutes, which was composed of 0.2 mol/liter palladium chloride, 0.4 mol/liter tin chloride, 0.05 mol/liter hydrochloric acid and 0.5 mol/liter sodium chloride, and was again washed with water. In addition, the resonator was immersed in an activating solution composed of 3 percent of sulfuric acid at 40° C. for 3 minutes, so that the electroconductive material deposited on the surfaces of the resonator was activated. In this stage, the surface resistance in the dielectric resonator was approximately 50 k$\Omega$.

Next, electrolytic plating was initiated in an electrolytic bath for copper plating composed of 14 g/liter copper pyrophosphate, 120 g/liter potassium pyrophosphate, an appropriate amount of a nonionic surfactant and 28 percent of aqueous ammonia having a pH of 8.8, in which the bath temperature and the initial current density were set to be 25° C. and 0.2 A/dm$^2$, respectively. The current density was then gradually increased so as to be 1.0 A/dm$^2$ after an elapse of 10 minutes from the start, and electrolytic plating by a rack plating method was performed for a total of 1 hour. A superior copper film was formed over the entire surface of the dielectric resonator including the insides of the penetrating holes. The thickness of the copper plated film was 3.6 to 4.0 $\mu$m, and the variation in the thickness was slight, whereby a superior electrode as an electrode for the dielectric resonator could be formed.

SECOND EXAMPLE

Instead of forming the copper electrode using the electrolytic bath for copper plating in the First Example, a silver electrode was formed using an electrolytic bath for silver plating. The electrolytic bath used for silver plating was composed of 20 g/liter silver cyanide, 100 g/liter potassium cyanide, 25 g/liter potassium carbonate and an appropriate amount of a cationic surfactant. Electrolytic plating was initiated in which the bath temperature and the initial current density were set to be 25° C. and 0.2 A/dm$^2$, respectively. The current density was then gradually increased so as to be 1.0 A/dm$^2$ after an elapse of 10 minutes from the start, and electrolytic plating by a rack plating method was performed for a total of 1 hour. As a result, a superior silver plated film was formed on the entire surface of the dielectric resonator including the inside of the penetrating holes. The thickness of the silver plated film was 3.0 to 3.4 $\mu$m, and the variation in the thickness was slight, whereby a superior electrode as an electrode for the dielectric resonator could be formed.

THIRD EXAMPLE

Instead of using the electrolytic bath for copper plating which was used in the First Example, a copper electrode was formed using a new electrolytic bath for copper plating having a composition described below. The electrolytic bath used for copper plating was composed of 50 g/liter copper sulfate, 200 g/liter sulfuric acid and an appropriate amount of a nonionic surfactant. Electrolytic plating was initiated in which the bath temperature and the initial current density were set to be 25° C. and 0.2 A/dm$^2$, respectively. The current density was then gradually increased so as to be 1.0 A/dm$^2$ after an elapse of 10 minutes from the start, and electrolytic plating by a rack plating method was performed for a total of 1 hour. As a result, a superior copper plated film was formed on the entire surface of the dielectric resonator including the insides of the penetrating holes. The thickness of the copper plated film was 4.0 to 4.8 $\mu$m, and a slight variation in the thickness thereof was observed; however, it was not so severe as to degrade the electric characteristics of the dielectric resonator.

FOURTH EXAMPLE

An external copper electrode was formed by the method described in the First Example on the entire surface of a dielectric resonator in the form of a block (size: 10×4×4 mm) made of a composite material composed of a resin and a ceramic having calcium titanate as a major component. As a result, a superior copper plated film could be formed on the entire surface of the dielectric resonator. The thickness of the copper plated film was approximately 3.5 to 3.8 $\mu$m, and the variation in the thickness was slight, whereby a superior electrode as an electrode for the dielectric resonator could be formed.

FIFTH EXAMPLE

An external copper electrode was formed on the entire surface of a dielectric resonator similar to that used in the First Example by the following method. The dielectric resonator was washed with an alkaline cleaner and then with water, and the surface of the dielectric resonator was etched by immersing it in a mixed solution of hydrofluoric acid and hydrochloric acid, in which each concentration thereof was approximately 1 to 3%, and was again washed with water. Next, the resonator was immersed in a conditioning solution composed of an anionic surfactant in an amount of 3 g/liter of a polyoxycarboxylate at 40° C. for 3 minutes, was then immersed in an electroconductive solution having a pH of 10.0 at 50° C. for 10 minutes, which was composed of 0.5 mol/liter copper chloride, 0.2 mol/liter tin chloride, 0.5 mol/liter ammonium citrate, 0.5 mol/liter ammonium chloride and an appropriate amount of aqueous ammonia, and was again washed with water. In addition, the resonator was immersed in an activating solution composed of 3 percent of sulfuric acid at 40° C. for 3 minutes, so that the electroconductive material deposited on the surface of the resonator was activated. In this stage, the surface resistance in the dielectric resonator was approximately 70 k$\Omega$.

Next, electrolytic plating was initiated in an electrolytic bath for copper plating composed of 14 g/liter copper pyrophosphate, 120 g/liter potassium pyrophosphate, an appropriate amount of a nonionic surfactant and 28 percent of aqueous ammonia having a pH of 8.8, in which the bath temperature and the initial current density were set to be 25° C. and 0.2 A/dm$^2$, respectively. The current density was then gradually increased so as to be 1.0 A/dm$^2$ after an elapse of 15 minutes from the start, and electrolytic plating by a rack plating method was performed for a total of 1 hour. As a result, a superior copper plated film was formed on the entire surface of the dielectric resonator including the inside of penetrating holes. The thickness of the plated copper film was 3.0 to 3.3 $\mu$m, and the variation in the thickness was slight, whereby a superior electrode as an electrode for the dielectric resonator could be formed.

SIXTH EXAMPLE

Instead of forming the copper electrode using the electrolytic bath for copper plating in the Fifth Example, a silver electrode was formed using an electrolytic bath for silver plating. The electrolytic bath used for silver plating was composed of 20 g/liter silver cyanide, 100 g/liter potassium cyanide, 25 g/liter potassium carbonate and an appropriate amount of a cationic surfactant. Electrolytic plating was initiated in which the bath temperature and the initial current density were set to be 25° C. and 0.2 A/dm$^2$, respectively. The current density was then gradually increased so as to be 1.0 A/dm$^2$ after an elapse of 15 minutes from the start, and electrolytic plating by a rack plating method was performed for a total of 1 hour. As a result, a superior silver plated film was formed on the entire surface of the dielectric resonator including the insides of the penetrating holes. The thickness of the silver plated film was 3.2 to 3.5 $\mu$m, and the variation in the thickness was slight, whereby a superior electrode as an electrode for the dielectric resonator could be formed.

SEVENTH EXAMPLE

External lead electrodes for multilayer chip capacitors (sizes: 3.2×1.6 mm and 1.0×0.5 mm) primarily composed of barium titanate were formed by the following method. The multilayer chip capacitors were washed with an alkaline cleaner and were then washed with water. An edge surface of each multilayer chip capacitor was only exposed and the other parts thereof were covered with a resist. Subsequently, in a manner similar to that described in the First Example, the edge surface of each multilayer chip capacitor was sequentially treated with a conditioning solution, an electroconductive solution and an activating solution, so that the edge surface of the multilayer chip capacitor was made to be electroconductive by depositing an electroconductive material thereon.

Next, electrolytic plating was initiated in an electrolytic bath having a pH of 7.0 for nickel plating composed of 100 g/liter nickel sulfate, 20 g/liter nickel chloride, 35 g/liter ammonium sulfate, 140 g/liter sodium citrate and 30 g/liter sodium gluconate, in which the bath temperature and the initial current density were set to be 60° C. and 0.5 A/dm$^2$, respectively. After initiating electrolytic plating, the current density was gradually increased so as to be 2.0 A/dm$^2$ after an elapse of 10 minutes from the start, and barrel plating was performed for a total of 1 hour.

Subsequently, barrel plating was performed at a bath temperature of 25° C. and at a current density of 0.25 A/dm$^2$ for approximately 1 hour by using an electrolytic bath for tin plating composed of 0.1 mol/liter tin sulfate, 0.5 mol/liter citric acid, 1.0 mol/liter ammonium sulfate and an appropriate amount of an cationic surfactant. After the completion of plating, the resists used for covering were removed, whereby multilayer chip capacitors were obtained in which a plated film was formed only on the edge surface thereof. When the plated film was analyzed, a superior nickel plated film approximately 3 $\mu$m thick was observed on the surface of the capacitor, and a superior tin film approximately 4 $\mu$m thick was observed on the nickel plated film, so that a laminate film thus formed could be used as an external lead electrode for the multilayer chip capacitor.

EIGHTH EXAMPLE

An external lead electrode for a chip thermistor primarily composed of manganese oxide was formed in a manner similar to those described in the Sixth Example. As a result, two layers, i.e., a superior nickel plated film approximately 3 $\mu$m thick and a superior tin plated film approximately 4 $\mu$m thick, were formed on an edge surface of the chip thermistor, so that a laminate film thus formed could be used as an external lead electrode therefor.

In addition, by using the method described in the Seventh Example for forming electrodes for electronic chip devices which require external lead electrodes, such as chip varistors and PTC thermistors, a superior external lead electrode could be formed on an edge surface of each electronic chip device.

First Comparative Example

In a repetition of the First Example, the step of immersion in the conditioning solution composed of a cationic surfactant in the process for forming an electrode was not carried out. As a result, deposition of metal during a subsequent step of electrolytic plating could not be observed. When the reason for this was studied, it was confirmed that in the First Example, the deposited amount of palladium colloid on the surface of the dielectric resonator after contact with the electroconductive solution was 3 $\mu$g/cm$^2$, and the surface resistance thereof was 50 k$\Omega$. On the other hand, in the First Comparative Example, the deposited amount of palladium colloid was 0.3 $\mu$g/cm$^2$ and the surface resistance thereof was 1 M$\Omega$ or more, and hence, the surface condition was not suitable for electrolytic plating.

Second Comparative Example

In a repeat of the First Example, the step of electrolytic plating for copper plating in the process for forming an electrode was carried out in which the current density was set to be 1.0 A/dm$^2$ from the beginning of plating. As a result, a copper plated film was formed over the entire surface of the dielectric resonator; however, the plated film was rough, and considerable variation in thickness of the plated film, i.e., 2.0 to 5.0 $\mu$m, was observed. Accordingly, an electrode which may degrade the characteristics of the dielectric resonator could be formed.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for forming an electrode on a surface of an electronic device comprising a ceramic material, comprising
    obtaining a surface charge on the ceramic material by contacting the electronic device with a solution comprising a cationic or an anionic surfactant;
    depositing an electroconductive material on the surface of the ceramic material by contacting the electronic device with a solution containing an electroconductive material having a polarity opposite to the polarity of the surface charge;
    activating the electroconductive material; and
    electrolytically plating a metal on the surface of the activated electroconductive material deposited on the surface of the ceramic material.

2. A method for forming an electrode according to claim 1, wherein the solution of electroconductive material comprises at least one member selected from the group consisting of a complex, a colloid, a hydroxide of a transition metal, a mixture of complexes, a mixture of colloids and a mixture of hydroxides of transition metals.

3. A method for forming an electrode according to claim 2, wherein the transition metal is at least one member selected from the group consisting of palladium, silver, copper, tin and nickel.

4. A method for forming an electrode according to claim 3, wherein during the step of performing electrolytic plating, a current density is employed initially at a fraction of the maximum current density during said plating and the current density is thereafter increased after an elapse of a predetermined time.

5. A method for forming an electrode according to claim 4, wherein the initial current density is about 5 to 50% of the maximum current density.

6. A method for forming an electrode according to claim 5, wherein the surfactant is cationic.

7. A method for forming an electrode according to claim 6, wherein the cationic surfactant is a polyethylene glycol.

8. A method for forming an electrode according to claim 5, wherein the surfactant is anionic.

9. A method for forming an electrode according to claim 8, wherein the anionic surfactant is a polycarboxylate.

10. A method for forming an electrode according to claim 5, wherein the surface of the device subjected to the process has a resistivity of at least about 100 $\Omega \cdot cm$.

11. A method for forming an electrode according to claim 1, wherein during the step of performing electrolytic plating, a current density is employed initially at a fraction of the maximum current density during said plating and the current density is thereafter increased after an elapse of a predetermined time.

12. A method for forming an electrode according to claim 11, wherein the initial current density is about 5 to 50% of the maximum current density.

13. A method for forming an electrode according to claim 1, wherein the surfactant is cationic.

14. A method for forming an electrode according to claim 1, wherein the surfactant is anionic.

15. A method for forming an electrode according to claim 1, wherein the surface of the device subjected to the process has a resistivity of at least about 100 $\Omega \cdot cm$.

16. A method for forming an electrode on a surface of an electronic device comprising a ceramic material having a resistivity of at least about 100 $\Omega \cdot cm$, comprising:

obtaining a surface charge on the ceramic material by contacting the electronic device with a solution comprising a cationic or an anionic surfactant so as to impose a surface charge on a surface of the device;

depositing an electroconductive material comprising a transition metal which is at least one member selected from the group consisting of palladium silver, copper, tin and nickel on the surface of the ceramic material by contacting the electronic device with a solution containing an electroconductive material having a polarity opposite to the polarity of the surface charge;

activating the electroconductive material;

electrolytically plating a metal selected from the group consisting of copper, nickel, tin, gold, platinum, palladium and an alloy thereof on the surface of the activated electroconductive material deposited on the surface of the ceramic material at a first current density; and increasing the current density to a value which is about 2 and 20 times the first current density.

17. A method for forming an electrode according to claim 16, wherein the surfactant is cationic.

18. A method for forming an electrode according to claim 17, wherein the cationic surfactant is a polyethylene glycol.

19. A method for forming an electrode according to claim 16, wherein the surfactant is anionic.

20. A method for forming an electrode according to claim 19, wherein the anionic surfactant is a polycarboxylate.

\* \* \* \* \*